United States Patent [19]

Brown et al.

[11] Patent Number: 5,700,332
[45] Date of Patent: Dec. 23, 1997

[54] SEGREGATED TANDEM FILTER FOR ENHANCED CONVERSION EFFICIENCY IN A THERMOPHOTOVOLTAIC ENERGY CONVERSION SYSTEM

[75] Inventors: Edward J. Brown; Paul F. Baldasaro, both of Clifton Park; Randolph J. Dziendziel, Middlegrove, all of N.Y.

[73] Assignee: The United States of America as represented by the United States Department of Energy, Washington, D.C.

[21] Appl. No.: 678,741

[22] Filed: Jul. 11, 1996

[51] Int. Cl.$^6$ ............................. H02N 6/00; G02B 5/28
[52] U.S. Cl. ........................ 136/253; 136/257; 359/359; 359/590
[58] Field of Search ........................ 136/253, 257; 359/359, 590

[56] References Cited

U.S. PATENT DOCUMENTS

| | | | |
|---|---|---|---|
| 2,668,478 | 2/1954 | Schroder | 359/359 |
| 3,247,392 | 4/1966 | Thelen | 250/226 |
| 3,331,707 | 7/1967 | Werth | 136/253 |
| 3,591,420 | 7/1971 | Streed | 136/257 |
| 3,751,303 | 8/1973 | Kittl | 136/253 |
| 4,017,758 | 4/1977 | Almer et al. | 313/112 |
| 4,331,829 | 5/1982 | Palazzetti et al. | 136/253 |
| 4,584,428 | 4/1986 | Gaarlick | 136/257 |
| 4,764,104 | 8/1988 | Nelson | 431/100 |
| 5,138,485 | 8/1992 | Ishida et al. | 359/359 |
| 5,304,255 | 4/1994 | Li et al. | 136/257 |
| 5,403,405 | 4/1995 | Fraas et al. | 136/253 |
| 5,611,870 | 3/1997 | Horne et al. | 136/253 |
| 5,625,485 | 4/1997 | Bolger | 359/326 |

OTHER PUBLICATIONS

H. Höfler et al, Solar Cells, vol. 10, pp. 273–286 (Dec. 1983).

P.F. Baldasaro, E.J. Brown, D.M. DePoy, B.C. Campbell and J.R. Parrington, Experimental Assessment of Low Temperature Voltaic Energy Conversion, First NREL Conference on Thermophotovoltaic Generation of Electricity, Jul. 24–27, 1994.

H.A. MacLeod, Thin Film Optical Filters, McGraw–Hill Publishing Co., 1969, pp. 101–107, 111–124, 143–153.

C.M. Lampert, Heat Mirror Coatings for Energy Conserving Windows, Solar Energy Materials, vol. 6, 1981, pp. 1–41.

G.W. Charache, D.M. DePoy, P.F. Baldasaro, and B.C. Campbell Thermophotovoltaic Devices Utilizing a Back Surface Reflector for Spectral Control, The American Institute of Physics(AIP) Conference Proceedings, vol. 358, p.339, Jul. 1995.

Primary Examiner—Aaron Weisstuch
Attorney, Agent, or Firm—Virginia B. Caress; William R. Moser; Paul A. Gottlieb

[57] ABSTRACT

A filter system to transmit short wavelength radiation and reflect long wavelength radiation for a thermophotovoltaic energy conversion cell comprises an optically transparent substrate segregation layer with at least one coherent wavelength in optical thickness; a dielectric interference filter deposited on one side of the substrate segregation layer, the interference filter being disposed toward the source of radiation, the interference filter including a plurality of alternating layers of high and low optical index materials adapted to change from transmitting to reflecting at a nominal wavelength $\lambda_{IF}$ approximately equal to the bandgap wavelength $\lambda_g$ of the thermophotovoltaic cell, the interference filter being adapted to transmit incident radiation from about $0.5\lambda_{IF}$ to $\lambda_{IF}$ and reflect from $\lambda_{IF}$ to about $2\lambda_{IF}$; and a high mobility plasma filter deposited on the opposite side of the substrate segregation layer, the plasma filter being adapted to start to become reflecting at a wavelength of about $1.5\lambda_{IF}$.

15 Claims, 6 Drawing Sheets

SEGREGATED TANDEM FILTER FOR ENHANCED CONVERSION EFFICIENCY IN A THERMOPHOTOVOLTAIC ENERGY CONVERSION SYSTEM

FIELD OF THE INVENTION

This invention was made under contract with the U.S. Department of Energy.

The present invention relates to the field of thermophotovoltaic (TPV) direct energy conversion. In particular, the present invention relates to filters which increase conversion efficiency for use in TPV systems to prevent parasitic capture of sub-bandgap energy.

BACKGROUND OF THE INVENTION

Thermophotovoltaic (TPV) energy systems convert thermal energy to electric power using the same principle as solar cells. In particular, a heat source (the radiator) radiatively emits photons which are incident on a semiconductor TPV cell. Photons with energy greater than the semiconductor bandgap ($E_g$) excite electrons from the valence band to the conduction band (inter-band transition). The resultant electron-hole pairs (ehp) are mobile and may be collected by metal contacts, in turn powering external electrical loads. Photons with less energy than $E_g$ are parasitically absorbed as heat.

To increase the efficiency of a TPV energy system, some form of spectral control is employed to reduce the amount of energy that is parasitically absorbed. The spectral sensitivity range of a TPV cell is related to the cell bandgap by the following relationship:

$$\lambda_g(\mu m) = 1.24/E_g(eV)$$

The TPV cells are sensitive to incident radiation with a wavelength equal to or less than $\lambda_g$.

Investigators have been reporting attempts to fabricate a practical TPV conversion system since the early 1960's. Early attempts were abandoned because they were based on silicon cells which required very high radiator temperatures due to their high bandgap (1.1 eV); this silicon cells are not sensitive to radiation longer than about 1.1 micrometers. Unless the radiator could operate above several thousand degrees Celsius, a system based on silicon TPV cells would suffer from low efficiency and very low power output.

When other semiconductor materials became available, the potential for lower bandgap TPV cells created renewed interest in TPV energy conversion. See *An Experimental Assessment of Low Temperature Voltaic Energy Conversion*, Baldasaro, P. F. et al, First NREL Conference on Thermophotovoltaic Generation of Electricity, Jul. 24–27, 1994. In particular, Fraas et al., U.S. Pat. No. 5,403,405, described a TPV conversion system based on GaSb in 1989. Because of their lower bandgap, the sensitivity range of these cells was extended to about 1.7 micrometers. Ternary systems such as InGaAs have been fabricated with a bandgap of 0.55 eV which extend the sensitivity range to about 2.2 micrometers.

To understand the significance of lowered TPV cell bandgap, consider a TPV system with a blackbody radiator operating at 1250° C. If silicon cells are employed, only 2.7% of the total radiant flux is above the cell bandgap; thus, more than 97% of the energy is unavailable for conversion to electric output. If the silicon cells are replaced with GaSb cells having a bandgap of 0.73 eV, the fraction of the radiant spectrum above the bandgap increases to 18.4%, a potential increase in electric power output by a factor of more than 5.

If the low bandgap InGaAs (0.55 eV) cells are used, the fraction of radiant energy above the bandgap for a 1250° C. radiator increases to 35.4%.

It is noted however, that while the lower bandgap cells significantly increase the power output, a considerable fraction of the input radiant energy remains below the cell bandgap and is, therefore, unavailable for conversion. In the example of the GaSb cells above, 81.6% of the energy emitted by the 1250° C. radiator is not convertible and will be absorbed as waste heat, drastically reducing system conversion efficiency. Furthermore, at lower radiator temperatures, the problem is aggravated. For example, at a radiator temperature of 1000° C., the waste energy fraction with GaSb cells increases to 90.4%.

A number of investigators have addressed the issue of waste energy in an attempt to improve overall system conversion efficiency. In one approach, the blackbody radiator was replaced with a "selective emitter" which emits radiant energy in a narrow band above the cell bandgap. Rare earth oxides are known to display this emission characteristic: Nelson et al., U.S. Pat. No. 4,746,104 describes one such system. Although this concept may improve efficiency, the power output will be unacceptably low in most applications at practical radiator temperatures. For example, consider the emission spectrum for erbium oxide. At a radiator temperature of 1000° C., the total radiant emission of a perfect blackbody will be about 15 watts/cm$^2$. Of that value, 23.1% (3.4 watts/cm$^2$) is above the bandgap of the 0.55 eV in InGaAs cells. For the erbium oxide selective emitter, it is estimated that the radiant output available for electrical conversion will be less than 0.4 watts/cm$^2$. Thus, very little energy, in absolute terms, is available for conversion to electricity.

Another approach to the waste energy issue is the back surface reflection concept. Most of the above-bandgap energy is absorbed in the active region of the cell while most of the below-bandgap energy passes through the cell and reaches the back surface. It is reflected and returned to the radiator after passing through the cell a second time. This is discussed in Charache, G. W. et. al., *Thermophotovoltaic Devices Utilizing a Back Surface Reflector for Spectral Control*, The American Institute of Physics (AIP) Conference Proceedings, Vol. 358, p. 339, July 1995. One critical issue associated with this approach is the amount of below-bandgap energy parasitically absorbed during transit through the cell.

Another answer to improve efficiency is the placement of a selective filter between the radiator and the TPV cell. The simplest filter is a short wave pass multilayer dielectric interference filter. See *Thin Film Optical Filters*, MacLeod, H. A., Chapter 5, pp. 101–107, Chapter 6, pp. 111–124, pp. 143–153, McGraw-Hill Publishing Co., 1969. The theoretical design and fabrication of interference filters are well understood processes. The drawback of the interference filter is its limited reflection range. The well designed filter transmits energy above the cell bandgap ($\lambda<\lambda_g$) and reflects energy below the bandgap ($\lambda>\lambda_g$). It is not reasonable, however, to expect the reflection range to extend beyond about $2\lambda_g$. In a typical TPV system, approximately 25% of the blackbody spectrum lies beyond the reflection band of the shortwave pass filter and will, therefore, be absorbed as waste heat.

Diffraction filters work well but require too much volume (by at least a factor of 10). Interference filters are small, can be highly transmissive above the TPV cell bandgap and have excellent reflectivity below the TPV cell bandgap. They also show very sharp transition between regions of high and low reflection. Unfortunately, the reflectivity range of interference filters is limited. In most cases, approximately 25% of the blackbody radiation is emitted at wavelengths beyond the reflective range of a practical interference filter.

Instead of an interference filter, one may substitute a solid-state plasma filter. These plasma filters are typically transparent conducting oxide (TCO) films or layers of heavily doped ($\approx 10^{20}$ cm$^{-3}$) semiconductors. As an example, indium-tin, oxide films have been employed in architectural window design under the general description of "heat windows" to control heat ingress and losses. Plasma filters have an extended reflection range far into the infrared region. The transition from transmission to reflection, however, is slow and plasma filters always suffer from a region of parasitic absorption near the TPV cell bandgap wavelength which results in large energy losses. The filter shows a gradual transition between the low reflection and high reflection regions. The reflection zone also extends far into the long wavelength region.

The concept of a tandem filter has been proposed which uses both the plasma filter and the dielectric interference filter. Almer U.S. Pat. No. 4,017,758, proposed such an arrangement for application in an incandescent light bulb design. His concept used a low mobility TCO film designed to transmit in the visible light region. Extending his approach to the near IR region results in significant increases in parasitic losses. Almer does not discuss these losses because of his limited application to the visible region.

Fraas et al. U.S. Pat. No. 5,403,405 proposed the use of a non-segregated tandem filter concept in an infrared TPV application. In his embodiment, however, he failed to address the anti-reflection effects associated with the direct application of a dielectric interference filter on a plasma layer. This effect reduces the reflection performance of the plasma filter beyond the reflection range of the interference filter which increases the parasitic losses due to absorption of below-bandgap energy.

The Fraas et al. non-segregated tandem filter was fabricated on a substrate. A transparent conducting oxide plasma filter was deposited on the substrate followed by a short-wave pass interference filter. This filter was basically quarter-wave layers of high optical index and low optical index materials deposited in alternating fashion. The non-segregated tandem filter has limited success because the plasma filter unavoidably functions as another layer of the interference filter based on its thickness and optical index. Invariably, this causes the interference filter to act as an anti-reflection coating in the spectral region beyond $2\lambda_{IF}$ where the plasma reflection should be large. Beyond about 5 micrometers, one would expect to see increasing reflection from the plasma filter; instead large oscillations occur in this region due to interference phenomena.

In a TPV conversion system, spectral control via selective filters requires a filter (or filter system) with high transmission of energy above the TPV cell bandgap; high reflection of energy below the TPV cell bandgap; sharp transition between regions of high and low reflection; low absorption of energy at all significant wavelengths; and which is physically small so that the TPV system maintains high volumetric power density. None of the filters identified above meets all of these requirements.

There is, therefore, a need for a filter system that will increase conversion efficiency by minimizing the fraction of below-bandgap energy that passes through the filter system.

OBJECTS AND SUMMARY OF THE INVENTION

It is an object of the present invention to provide a segregated tandem filter for a photovoltaic conversion system that provides high transmission of energy above the TPV cell bandgap.

It is another object of the present invention to provide a segregated tandem filter for a photovoltaic conversion system that provides high reflection of energy below the TPV cell bandgap.

It is still another object of the present invention to provide a segregated tandem filter for a photovoltaic conversion system that provides a sharp transition between regions of high and low reflection.

It is an object of the present invention to provide a segregated tandem filter system for a photovoltaic conversion system that provides low absorption of energy at all significant wavelengths.

It is another object of the present invention to provide a segregated tandem filter for a photovoltaic conversion system that provides a physically small filter unit so that the TPV system maintains high volumetric power density.

In summary, the present invention provides a segregated tandem filter for a photovoltaic energy conversion cell to transmit short wavelength radiation and reflect long wavelength radiation. The filter comprises an optically transparent substrate segregation layer with at least one coherent wavelength in optical thickness; a dielectric interference filter deposited on one side of the substrate segregation layer, the interference filter being disposed toward the source of radiation, the interference filter including a plurality of alternating layers of high and low optical index materials adapted to change from transmitting to reflecting at a nominal wavelength $\lambda_{IF}$ approximately equal to the bandgap wavelength $\lambda_g$ of the thermophotovoltaic cell, the interference filter being adapted to transmit incident radiation from about $0.5\lambda_{IF}$ to $\lambda_{IF}$ and reflect from $\lambda_{IF}$ to about $2\lambda_{IF}$; and a high mobility plasma filter deposited on the opposite side of the substrate segregation layer, the plasma filter being adapted to start to become reflecting at wavelength about $1.54\lambda_{IF}$.

These and other objects of the present invention will become apparent from the following detailed description.

BRIEF DESCRIPTIONS OF THE DRAWINGS

DETAILED DESCRIPTION OF THE INVENTION

Figure 1:
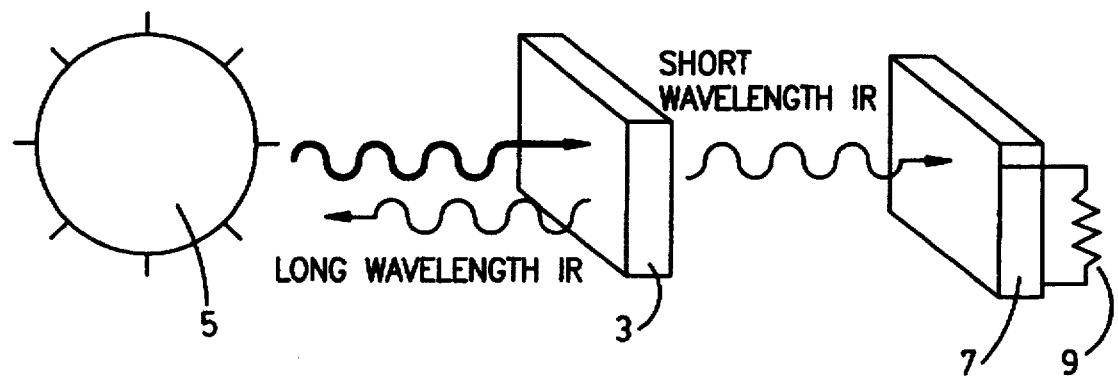
FIG. 1 is a schematic diagram of a typical thermophotovoltaic system with selective filter spectral control.

A typical thermophotovoltaic energy conversion system is disclosed in FIG. 1. A front surface selective filter 3 is situated between a thermal radiator 5 and a low bandgap conversion cell 7 for spectral control. The electric energy is dissipated in an external load 9. Typical cells for a practical application have bandgaps between approximately 0.5 and 0.85 eV. The radiator temperature for the typical system is between approximately 750° C. and 1500° C.

Figure 2:
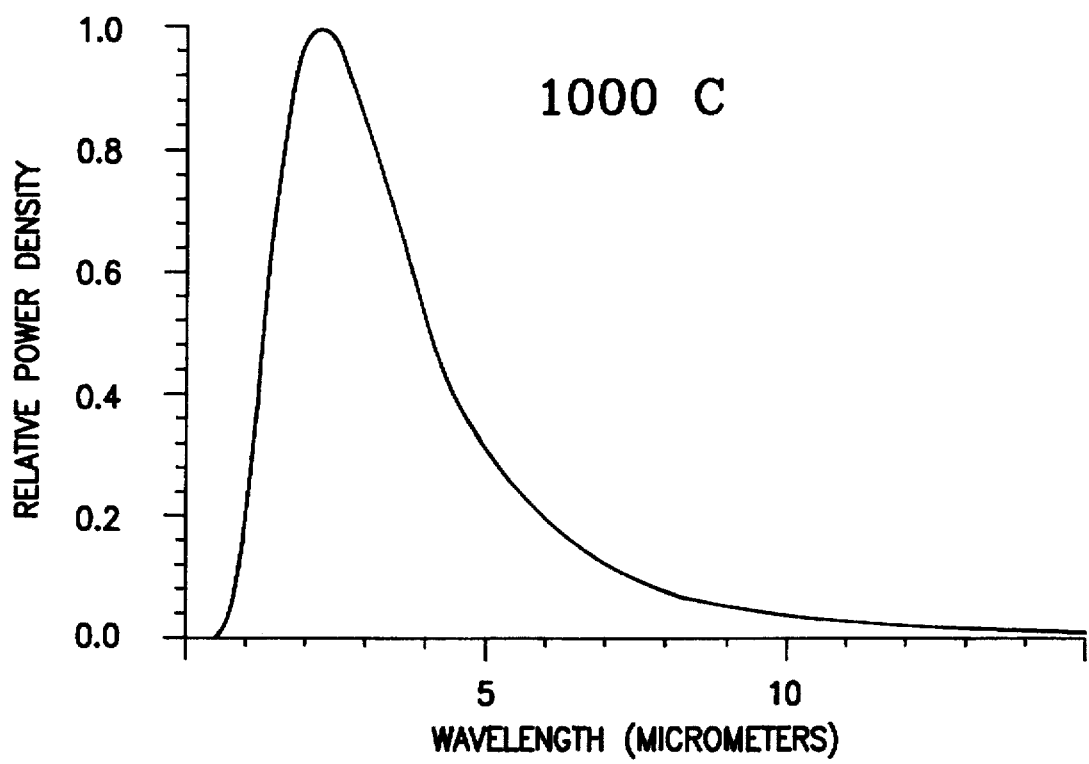
FIG. 2 is a graph of a blackbody emission spectrum at approximately 1000° C.

For illustration purposes, calculations will be presented for a system with 0.55 eV bandgap InGaAs cells (corresponding to about 2.2 micrometer wavelength) and a blackbody radiator operating at 1000° C. FIG. 2 shows the radiant energy spectrum for a 1000° C. blackbody radiator; the peak energy radiation occurs at 2.28 micrometers which is well matched to the InGaAs cells. Of the total radiant energy, 23.1% is above the bandgap and, therefore, available for conversion to electricity; 76.9% will be unavailable for electrical conversion.

A perfect spectral control system will have 100% transmission in the energy region above the cell bandgap; in this example from about 1.1 to 2.2 micrometers. At 2.2 micrometers, the system will abruptly change to 100% reflecting and remain so to about 15 micrometers. It is noted that these breakpoints are determined by the particular temperature and bandgap of this example; the concept of the front surface filter is equally valid for other cases but the extent of the reflection and transmission regions will be dictated by the parameters of those systems.

Figure 3:
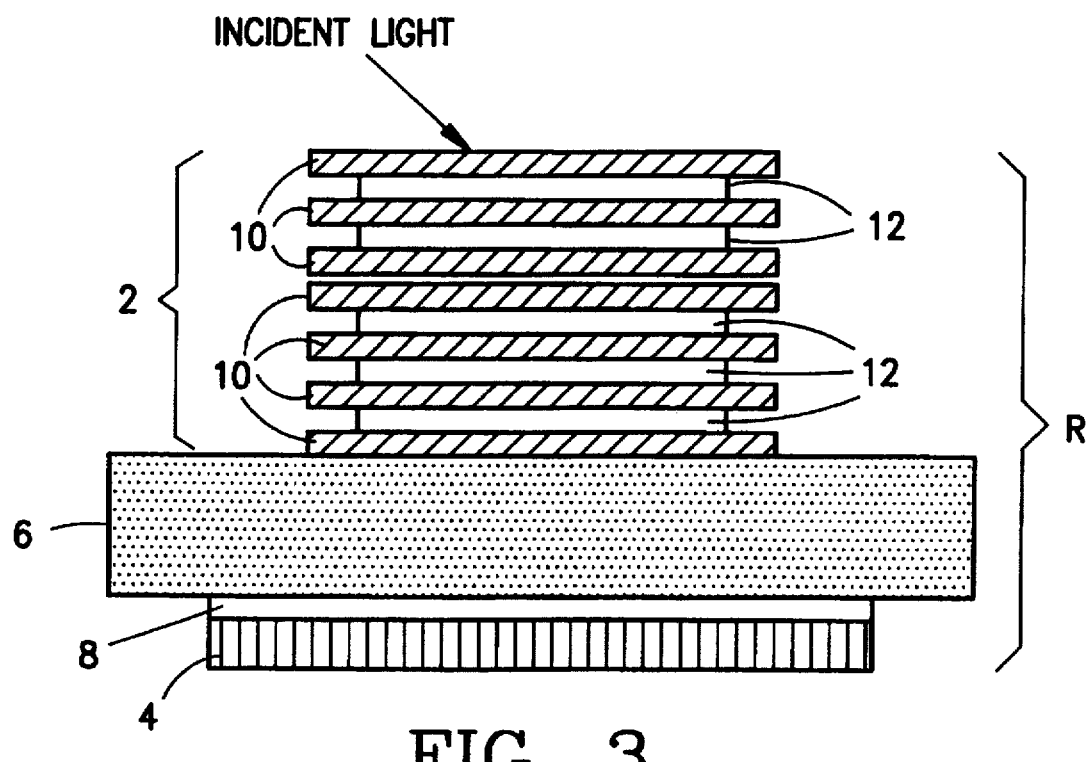
FIG. 3 is a cross-sectional view of a segregated tandem filter with a transparent conducting oxide or grown semiconductor plasma filter made in accordance with the present invention.

An embodiment of a segregated tandem filter R made in accordance with the present invention is disclosed in FIG. 3. An interference filter 2 is disposed on top of a plasma filter 4 separated by a segregation layer 6. An optical coupler 8 is disposed between the segregation layer 6 and the plasma filter 4 to increase the reflection performance of the plasma filter 4. The interference filter 2 and the plasma filter 4 are used together to achieve high reflection of below-bandgap energy far into the infrared region.

The interference filter 2 is on top of the plasma filter 4 to minimize the parasitic absorption in the plasma filter 4. The segregation layer 6 advantageously suppresses unwanted anti-reflection behavior of the interference filter 2 in adjacent wavelength regions. The layer 6 thickness is greater than a coherence length of the incident light; i.e. about 100–200 micrometers or more in optical thickness to be completely effective. The light must be incident on the interference filter 2 to minimize parasitic absorption.

The optical coupler 8 (anti-reflective coating) is applied between the substrate 6 and the plasma filter 4 to maintain high reflection.

The segregation layer 6 must be transparent to infrared radiation at all significant wavelengths and the layer must be mechanically stable and chemically compatible in the filter system. Materials of higher refractive index are desirable because the segregation effect is achievable with a layer of smaller physical thickness. Silicon is the preferred material for the substrate 6. Other suitable materials include zinc selenide, zinc sulfide, thorium fluoride, lead chloride, cerium oxide, lead fluoride, and cryolite.

Preliminary calculations supported by measurements of sample segregated tandem filters R indicate that layers 15–50 micrometers in optical thickness are partially effective in their suppression of the anti-reflection behavior in the segregated tandem filter R. Segregation layers that are thicker still are expected to show even better performance.

The short-wave pass interference filter 2 is deposited on one side of the transparent substrate 6. The interference filter 2 is formed from alternating layers 10 and 12 of high optical index and low optical index materials, respectively, and is designed such that the transition wavelength, $\lambda_{IF}$ approximately matches the TPV cell bandgap, $\lambda_g$. The typical interference filter 2 will transmit from about $0.5\lambda_{IF}$ to $\lambda_{IF}$ and will reflect from $\lambda_{IF}$ to about $2\lambda_{IF}$.

The preferred material for the high index layers 10 is silicon. Silicon monoxide is the preferred material for the low index layers 12. It is noted that silicon is an acceptable material in this application because these systems operate in the infrared region (silicon becomes transparent beyond about 1.1 micrometers). Silicon would not be acceptable in the visible region because it totally absorbs visible light. Alternative materials for the high index layers 10 are zinc selenide, zinc sulfide, niobium oxide, or other suitable materials. Alternative materials for the low index layers 12 are silicon dioxide, alumina, magnesium fluoride, and cryolite. Materials must be selected with an eye to their compatibility for chemical reactions, residual film stress, and adhesion on the chosen substrate.

All materials identified are commonly used in the optics industry and fabrication techniques are well known; these include electron beam evaporation, thermal evaporation, ion sputtering, chemical vapor deposition and plasma enhanced chemical vapor deposition. Other fabrication techniques may be used as well.

Figure 4:
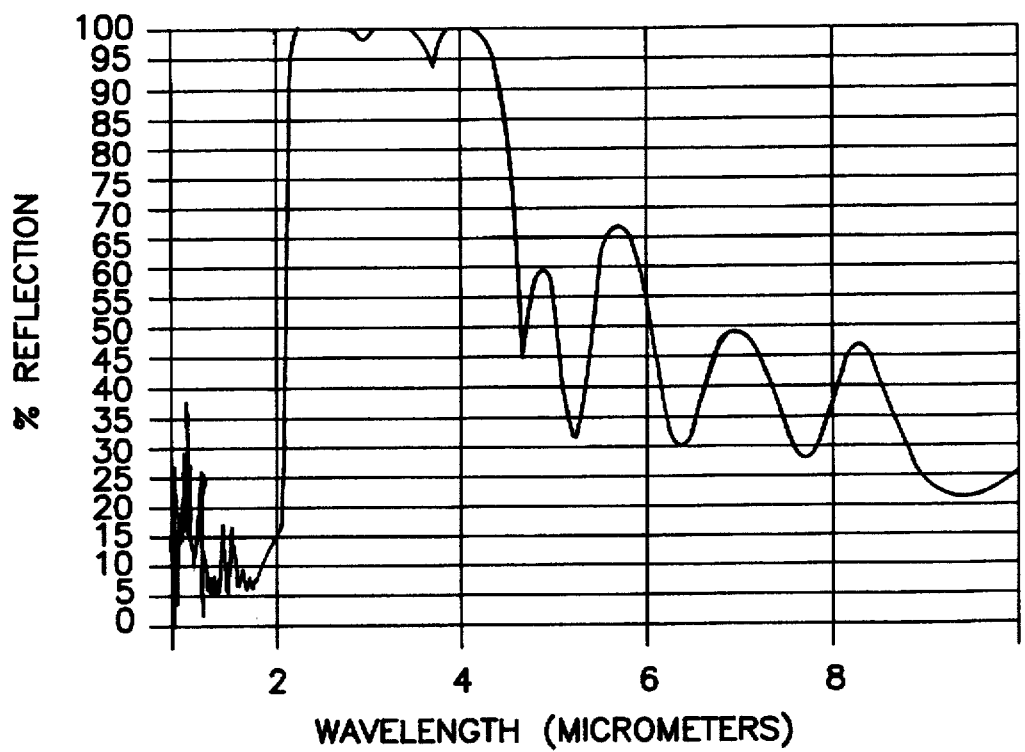
FIG. 4 is a graph of the reflection characteristic of a dielectric interference filter.
Figure 5:
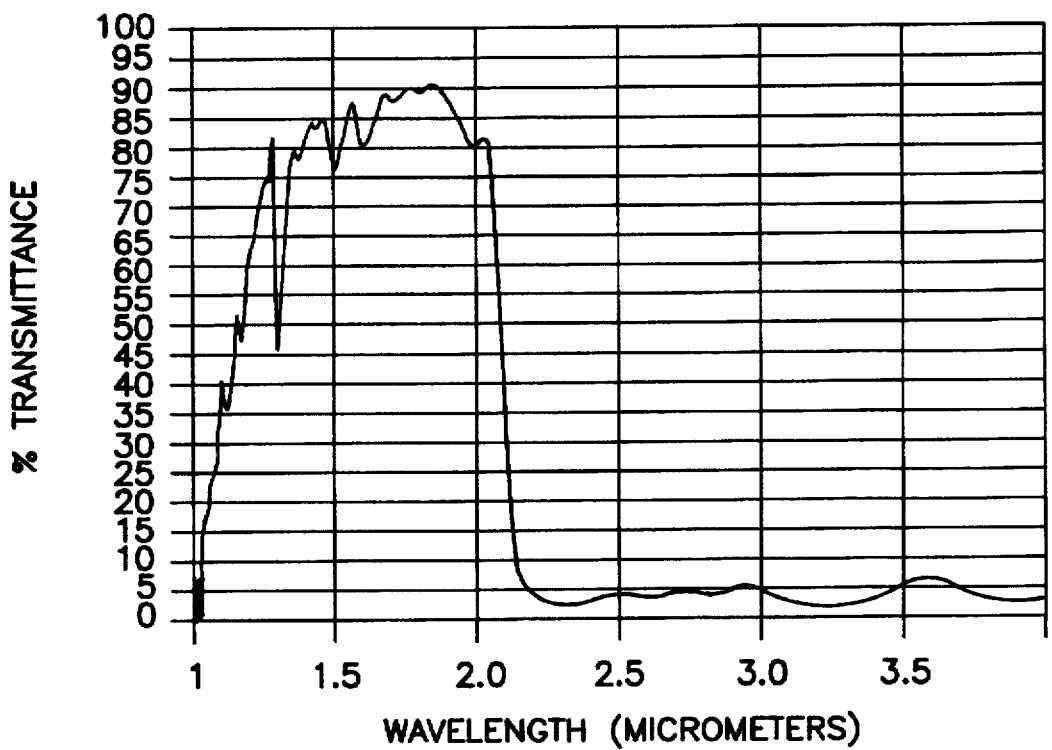
FIG. 5 is a graph of the transmission characteristic of a dielectric interference filter.

The reflection and transmission performance, respectively for the interference filter 2 designed for a 0.55 eV conversion cell and a 1000° C. radiator are shown in FIGS. 4 and 5, respectively. Approximately 85% of the energy radiated above the cell bandgap (1.1 to 2.2 micrometers) is transmitted through the filter; the remaining 15% is reflected back to the radiator. The reflection band extends from about 2.2 to 4.2 micrometers; within this band, nearly 100% of the energy emitted by the radiator is reflected back for reabsorption. The weakness of this filter when used alone in a TPV system is that only about 40% of the energy emitted beyond 4.2 micrometers is reflected; the remaining 60% is transmitted to the cell where it is parasitically absorbed and converted to waste heat. When this filter is used in conjunction with 0.55 eV cells and a radiator operating at 1000° C., the resultant spectral utilization is about 50%, which indicates that fully one-half of all absorbed energy is being converted to waste heat.

The plasma filter 4 (FIG. 3) is deposited or grown on the opposite side of the substrate or segregation layer 6 from the interference filter 2. The plasma filter 4 is designed such that its plasma wavelength occurs at approximately $1.5\lambda_g$. High mobility indium-tin oxide is the preferred material for the plasma filter 4 but indium oxide, cadmium stannate or highly doped gallium arsenide, gallium antimonide, or silicon may be substituted. The plasma filter 4 is a layer from 0.1 to 1.0 micrometer thick.

As described previously, the reflection performance of the plasma filter 4 is reduced by approximately 10% if the light is incident on the plasma layer 4 through the substrate 6. This is due to the fact that the index of refraction of the substrate 6 is higher than the index for air (n=1.0). This penalty is advantageously avoided by use of the optical coupler 8. Basically, the coupler 8 is an anti-reflection layer designed to function between the substrate 6 and the plasma layer 4 and suppress reflection in the range of about $2\lambda_g$ to $4\lambda_g$. In doing so, the light incident on the plasma filter 4 emerging from the substrate 6 "appears" to be coming from air rather than the higher index material of the substrate 6.

Figure 6:
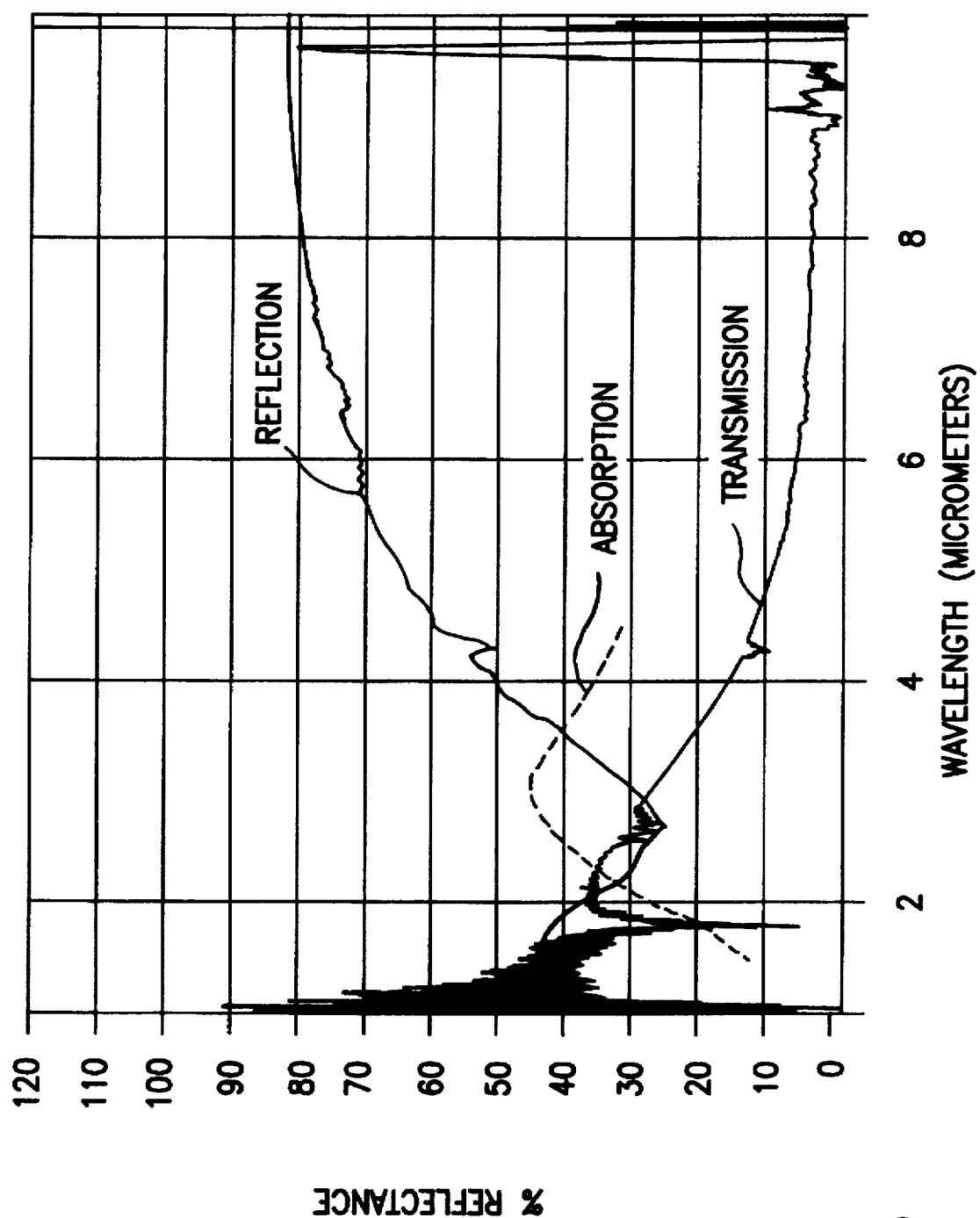
FIG. 6 is a graph of the reflection, transmission, and absorption for a plasma filter.

The reflection, transmission, and absorption for a plasma filter designed for use in a TPV energy conversion system with 0.55 eV cells ($\lambda_g=2.2$ micrometers) and a 1000° C. radiator is shown in FIG. 6. The filter begins to become reflective at a plasma wavelength of approximately 3 micrometers (which is about $1.5\lambda_g$).

The free carriers (electrons or holes) oscillate in response to the electric field associated with the incident radiation. The fields created by the displacement of the charge carriers will reflect most of the incident light with frequency below the plasma frequency, $\omega_p$, of the filter. The plasma frequency is given by:

$$\omega_p^2 = (4\pi Ne^2/m^*E_v)$$

where N is the free carrier charge density, m* is the effective carrier mass in the material and $E_v$ is the dielectric constant of the material.

The "turn-on" wavelength, $\lambda_p$, for a plasma filter is determined from the plasma frequency as follows:

$$\lambda_p = 2\pi c/\omega_p$$

where c is the speed of light.

In addition to reflection and transmission, FIG. 6 shows the typical plasma filter absorption band due to interaction between the incident light and the carriers. The absorption band occurs near the plasma wavelength and represents a major limitation to the effectiveness of plasma filters in a TPV application. The width of the plasma absorption band is inversely proportional to the free carrier relaxation time which is dependent on the carrier mobility of the material in question. High performance plasma filters will have high carrier mobility to limit parasitic losses and sharpen the transition to its reflection state. Most commercially available plasma filters have carrier mobilities from 10 to 40 cm²/V-sec.; Almer, in his patent, discusses plasma filters with mobilities less than 50 cm²/V-sec. For the present invention, plasma materials with free carrier mobilities of approximately 70 cm²/V-sec (or greater) are desired.

Figure 7:
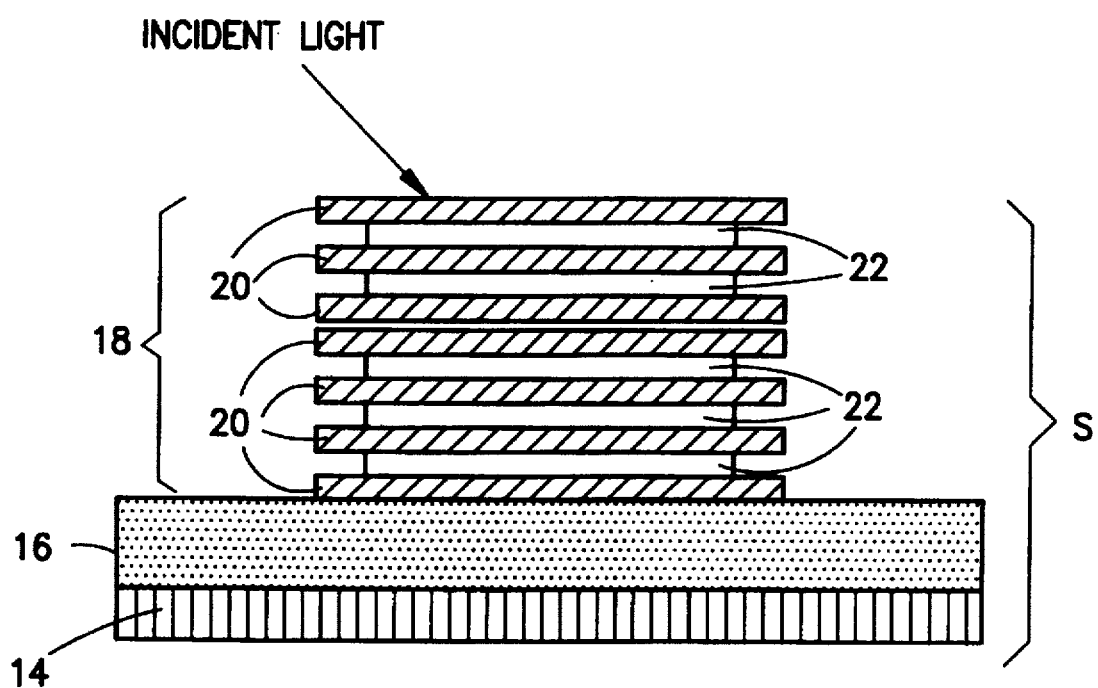
FIG. 7 is a cross-sectional view of a segregated tandem filter with highly doped implanted or diffused, semiconductor plasma filter, made in accordance with the present invention.

Another embodiment of the segregated tandem filter S is disclosed in FIG. 7. The filter S is fabricated by implanting or diffusing suitable dopant atoms into a specified substrate to produce a plasma filter layer in the substrate 16. Silicon is the preferred material for the substrate or segregation layer 16 but gallium arsenide, gallium antimonide, or other suitable materials may be substituted. A short-wave pass interference filter 18 is fabricated on one side of the substrate 16 which is formed from alternating layers 20 and 22 of high optical index and low optical index materials, respectively. All design parameters are similar to the segregated tandem filter R fabricated with a grown or deposited TCO plasma filter as shown in FIG. 3 and described above.

The high mobility plasma filter 14 is created within the substrate 16 by the incorporation of a suitable dopant material. The doped region is 0.1 to 1 micrometer thick. The preferred dopant is phosphorous but arsenic, boron, or other suitable materials may be substituted. The dopant material may be incorporated into the host material via ion implantation or thermal diffusion techniques. Alternatively, the dopant atom may be introduced during the growth process of the substrate material. It is noted that this approach has the disadvantage of not permitting an "optical coupler" between the substrate 16 and the plasma filter layer 14. Reflection beyond about $2\lambda_{IF}$ will suffer approximately a 10% reduction.

Figure 8:
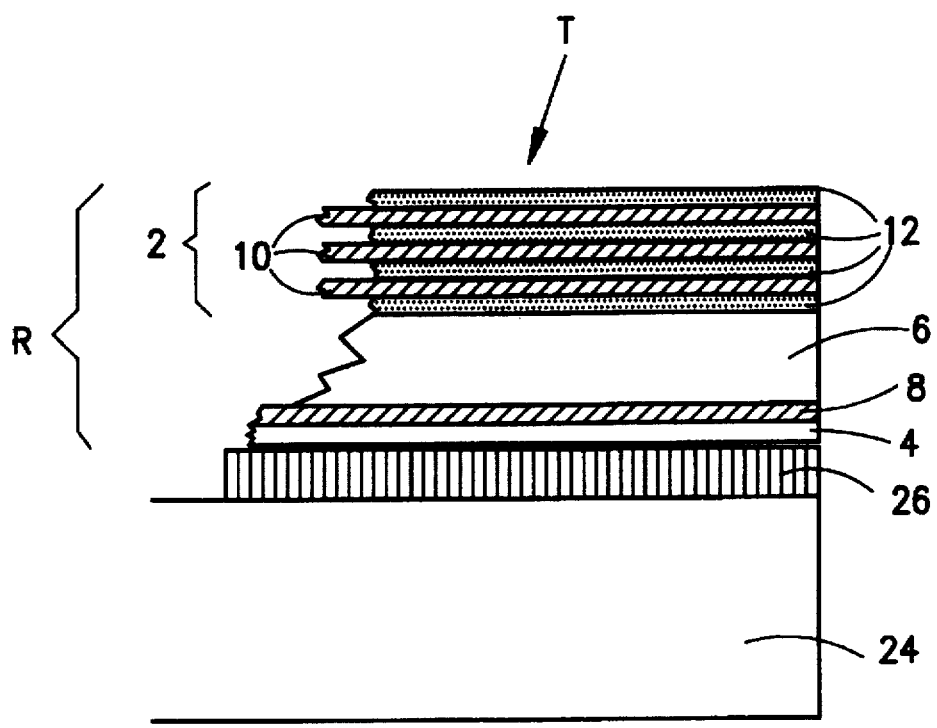
FIG. 8 is a cross-sectional view of a segregated tandem filter bonded to a thermophotovoltaic cell.

A thermophotovoltaic system T employing the segregated tandem filter R is disclosed in FIG. 8. The TPV cell bandgap, $E_g$, corresponds to a wavelength $\lambda_g$ and the blackbody radiator operates at a temperature such that its peak radiative output occurs at about $\lambda_g$.

The optical coupler layer 8 is deposited on the substrate 6 and acts as an anti-reflection coating designed to function between its adjacent materials and to minimize reflection between $2\lambda_g$ and $4\lambda_g$. The high mobility plasma filter 4 is deposited over the optical coupler 8. The plasma filter is designed such that its plasma wavelength $\lambda_p$, occurs at approximately $1.5\lambda_g$. The short-wave pass interference filter 2 is fabricated on the upper side of the substrate 6. The alternating layers 10 and 12 of high optical index and low optical index materials, respectively, are designed such that the reflection "turn on" wavelength, $\lambda_{IF}$ occurs at about the bandgap wavelength (i.e., $\lambda_{IF} \approx \lambda_g$). The interference filter 2 is transmissive from about $0.5\lambda_{IF}$ to $\lambda_{IF}$ and the reflection band will extend from $\lambda_{IF}$ to about $2\lambda_{IF}$.

The filter R is bonded to the TPV cell 24 with an optical adhesive 26, such as a two-material adhesive system that is heat cured or an ultraviolet cured adhesive. If an ultraviolet cured adhesive is used, the segregated tandem filter R must be transparent to the particular wavelength of ultraviolet light required to carry out the curing process.

The filter S without the optical coupler 8 may also be bonded to the TPV cell 24 with the optical adhesive 26.

Figure 9:
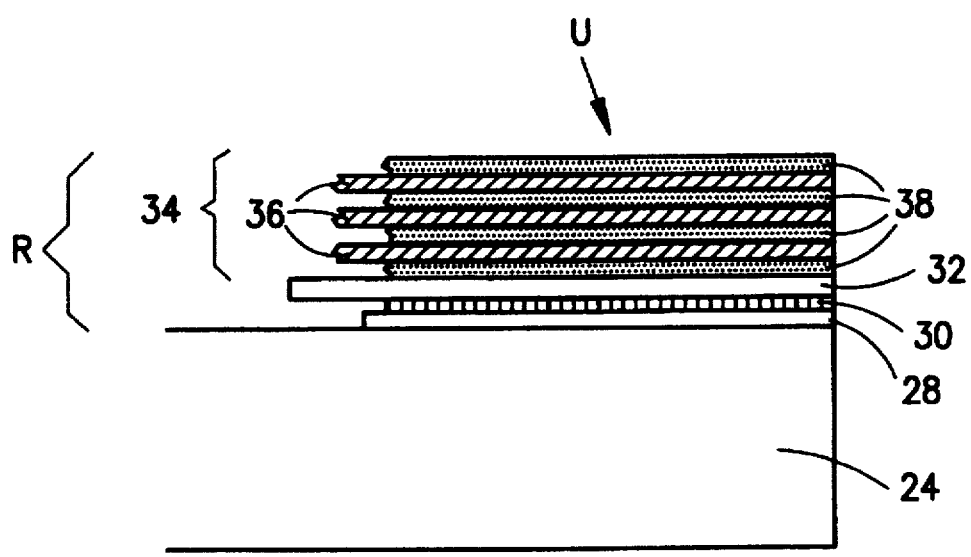
FIG. 9 is a cross-sectional view of segregated tandem filter directly deposited onto a thermophotovoltaic cell.

Another embodiment of a thermophotovoltaic system U is disclosed in FIG. 9. In this embodiment, the tandem filter R is fabricated directly on the TPV cell 24, thus omitting the need for the optical adhesive. The finished TPV cell 24 with a bandgap, $E_g$ (which corresponds to a wavelength $\lambda_g$) is coated with a high mobility plasma filter 28 designed such that its plasma wavelength, $\lambda_p$, will equal approximately $1.5\lambda_g$. Over this filter 28, an optical coupler layer 30 is deposited. This layer is an anti-reflection coating designed to function between its adjacent materials and to minimize reflection between about $2\lambda_g$ and $4\lambda_g$. Over the optical coupler 30, a thick segregation layer 32 is deposited; it is at least one coherence length in thickness (100–200 micrometers optical thickness) and is fabricated from silicon, zinc selenide, zinc sulfide, lead fluoride, cryolite, cerium oxide, lead chloride, thorium fluoride, or other suitable material that is optically transparent from about 1 to 15 micrometers.

Over the segregation layer 32, a short-wave pass dielectric interference filter 34 is deposited; it is formed from alternating layers 36 and 38 of high optical index and low optical index materials, respectively, designed such that the reflection "turn on" wavelength, $\lambda_{IF}$, occurs at about the bandgap wavelength (i.e., $\lambda_{IF} \approx \lambda_g$). The filter 34 is transmissive from about $0.5\lambda_{IF}$ to $\lambda_{IF}$ and the reflection band will extend from $\lambda_{IF}$ to about $2\lambda_{IF}$.

Figure 10:
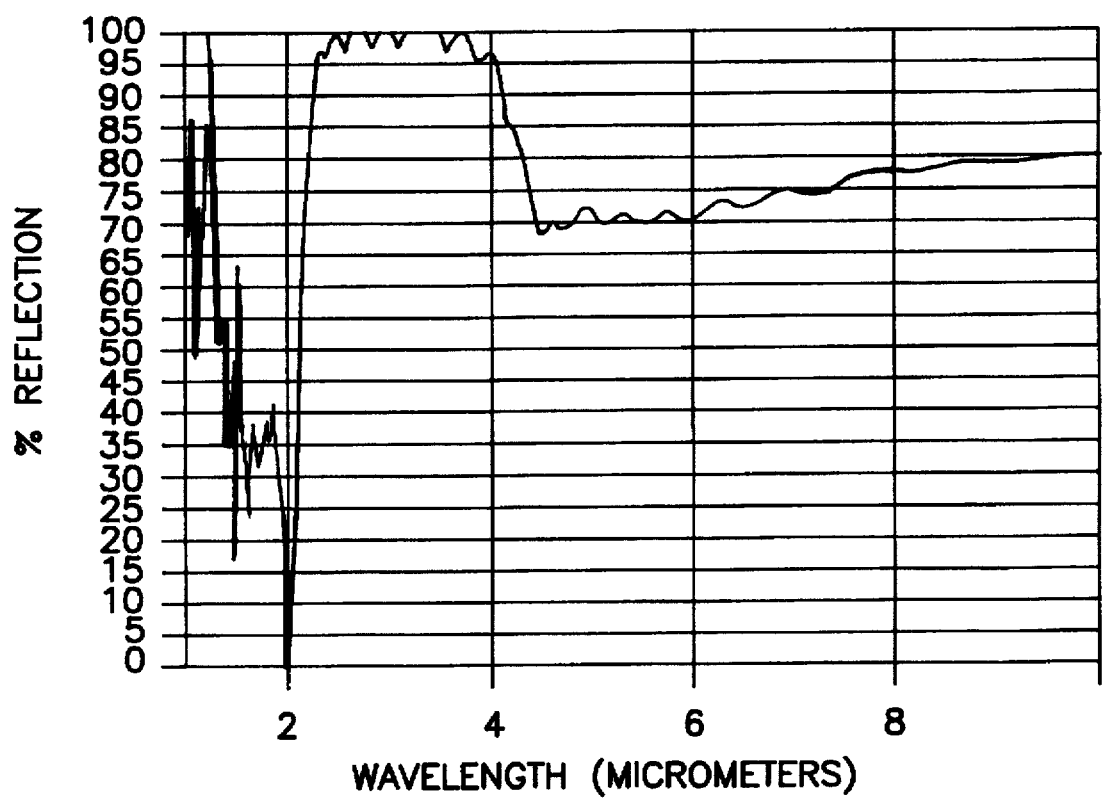
FIG. 10 is graph of the reflection characteristic of the segregated tandem filter of FIGS. 3 and 7.

The reflection performance of the segregated tandem filter is shown in FIG. 10. Note that beyond about 4.5 micrometers, reflection by the segregated tandem filter is controlled by the performance of the plasma filter and that reflection values are close to those of the plasma filter alone. Furthermore, there is no marked interference behavior (i.e. oscillatory suppression of reflection) in this region which would be characteristic of a tandem filter without the segregation layer. The purpose and effect of the segregation layer in the segregated tandem filter is to alleviate these interference effects.

It is useful to define a parameter to quantify the effectiveness of a filter system. Spectral utilization ($F_u$) is the fraction of all energy absorbed that is above the cell bandgap (available for conversion to electricity). It is defined below:

$$F_u = \frac{\text{Energy absorbed above } TPV \text{ cell bandgap}}{\text{All energy absorbed by the } TPV \text{ cell}}$$

Table 1 gives typical values for several spectral control options for a well designed TPV system:

TABLE 1

|  | SPECTRAL UTILIZATION |
|---|---|
| No spectral control | ≈0.25 |
| Interference filter alone | ≈0.50 |
| Plasma filter alone | ≈0.30 |
| Segregated tandem filter | ≈0.60 |

The segregated tandem filter advantageously improves the conversion efficiency of TPV systems by increasing the reflectivity of the filter in the below-bandgap region; by suppressing the anti-reflection behavior of an interference filter deposited directly on a plasma filter; by not requiring development of new interference filters or plasma filters; by permitting effective spectral control filters to be deposited directly on the TPV cell; and by omitting the need for filter substrates and the attendant problems of attaching the filters to the TPV cells with optical adhesives.

The segregated tandem filter advantageously satisfies the requirements for an efficient TPV system, such as high transmission of energy above the TPV cell bandgap; high reflection of energy below the TPV cell bandgap; sharp transition between regions of high and low reflection; low absorption of energy at all significant wavelengths; and small physical size so that the TPV system maintains high volumetric power density.

While this invention has been described as having preferred design, it is understood that it is capable of further modification, uses and/or adaptations of the invention following in general the principle of the invention and including such departures from the present disclosure as come within known or customary practice in the art to which the invention pertains, and as may be applied to the essential features set forth, and fall within the scope of the invention or the limits of the appended claims.

We claim:

1. A filter system to transmit short wavelength radiation and reflect long wavelength radiation for use with a predetermined thermophotovoltaic energy conversion cell, comprising:
   a) an optically transparent substrate segregation layer at least one coherence length in optical thickness;
   b) a dielectric interference filter deposited on one side of said substrate segregation layer, said interference filter adapted to being disposed toward the source of radiation, said interference filter including a plurality of alternating layers of high and low optical index materials adapted to change from transmitting to reflecting at a nominal wavelength $\lambda_{IF}$ approximately equal to the bandgap wavelength $\lambda_g$ of the thermophotovoltaic cell, said interference filter being adapted to transmit incident radiation from about $0.5\lambda_{IF}$ to $\lambda_{IF}$ and reflect from $\lambda_{IF}$ to about $2\lambda_{IF}$; and
   c) a high mobility plasma filter deposited on the opposite side of said substrate segregation layer, said plasma filter being adapted to start to become reflecting at a wavelength about $1.5\lambda_{IF}$.

2. A filter system as in claim 1, wherein:
said alternating layers of said interference filter are made of silicon and silicon monoxide.

3. A filter system as in claim 1, wherein:
said high optical index material is selected from the group consisting of silicon, zinc selenide, zinc sulfide, and niobium oxide.

4. A filter system as in claim 1, wherein:
said low optical index material is selected from the group consisting of silicon monoxide, cryolite, silicon dioxide, alumina, and magnesium fluoride.

5. A filter system as n claim 1, and further comprising:
an optical coupling layer disposed between said substrate segregation layer and said plasma filter, said optical coupling layer being adapted to minimize reflection from about $2.0\lambda_{IF}$ to $4.0\lambda_{IF}$.

6. A filter system as in claim 1, wherein:
said plasma filter comprises a layer of transparent conducting oxide.

7. A filter system as in claim 6, wherein:
said plasma filter is selected from the group consisting of indium-tin oxide, indium oxide, and cadmium stannate.

8. A filter system as in claim 6, wherein:
said plasma filter layer comprises a highly doped semiconducting material.

9. A filter system as in claim 8, wherein:
a) said highly doped semiconducting material is selected from the group consisting of doped gallium arsenide, gallium antimonide, and silicon;
b) the dopant is selected from the group consisting of boron, arsenic, and phosphorus.

10. A filter system as in claim 1, wherein:
said plasma filter is fabricated by creating a highly doped region within the opposite side of said substrate segregation layer.

11. A filter system as in claim 1, wherein:
said segregation layer is chosen from the group consisting of silicon, zinc selenide, zinc sulfide, thorium fluoride, lead chloride, cerium oxide, lead fluoride, and cryolite.

12. A filter system as in claim 1, wherein:
said substrate segregation layer is greater than a coherence length in optical thickness.

13. A thermophotovoltaic system, comprising:
a) a thermophotovoltaic cell;
b) a high mobility plasma filter bonded onto said thermophotovoltaic cell, said plasma filter being adapted to start to become reflecting at a wavelength of about $1.5\lambda_{IF}$, where $\lambda_{IF}$ is approximately equal to said thermophotovoltaic cell bandgap wavelength $\lambda_g$;
c) an optically transparent substrate segregation layer disposed on top of said plasma filter, said segregation layer having at least one coherence length in optical thickness; and
d) a dielectric interference filter deposited on top of said substrate segregation layer, said interference filter being disposed toward the source of radiation, said interference filter including a plurality of alternating layers of high and low optical index materials adapted to change from transmitting to reflecting at a nominal wavelength $\lambda_{IF}$, said interference filter being adapted to transmit incident radiation from about $0.5\lambda_{IF}$ to $\lambda_{IF}$ and reflect from $\lambda_{IF}$ to about $2\lambda_{IF}$.

14. A thermophotovoltaic system as in claim 13, wherein:
said plasma filter is bonded to said thermophotovoltaic cell by means of an optical adhesive.

15. A thermophotovoltaic system as in claim 13, wherein:
said plasma filter is directly deposited onto said thermophotovoltaic cell.

* * * * *